(12) United States Patent
Maevskii et al.

(10) Patent No.: US 11,239,945 B2
(45) Date of Patent: Feb. 1, 2022

(54) ENCODING METHOD, DECODING METHOD, APPARATUS, AND DEVICE

(71) Applicant: HUAWEI TECHNOLOGIES CO., LTD., Shenzhen (CN)

(72) Inventors: Aleksei Eduardovich Maevskii, Moscow (RU); Vladimir Gritsenko, Moscow (RU); Jian Wang, Hangzhou (CN); Hejia Luo, Hangzhou (CN); Gongzheng Zhang, Hangzhou (CN); Jie Jin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 187 days.

(21) Appl. No.: 16/585,467

(22) Filed: Sep. 27, 2019

(65) Prior Publication Data

US 2020/0028619 A1      Jan. 23, 2020

Related U.S. Application Data

(63) Continuation of application No. PCT/CN2018/080404, filed on Mar. 24, 2018.

(30) Foreign Application Priority Data

Apr. 5, 2017    (CN) .......................... 201710218791.9

(51) Int. Cl.
*H04L 1/00* (2006.01)
*H04L 12/18* (2006.01)

(52) U.S. Cl.
CPC .......... *H04L 1/0057* (2013.01); *H04L 1/0013* (2013.01); *H04L 1/0034* (2013.01);
(Continued)

(58) Field of Classification Search
CPC ... H04L 1/0057; H04L 1/0013; H04L 1/0034; H04L 1/0071; H04L 1/1819; H04L 1/08;
(Continued)

(56) References Cited

U.S. PATENT DOCUMENTS

2016/0013887 A1    1/2016   Shen et al.
2016/0079999 A1    3/2016   Shen et al.
(Continued)

FOREIGN PATENT DOCUMENTS

CN    101034953 A    9/2007
CN    101288255 A    10/2008
(Continued)

OTHER PUBLICATIONS

Huawei et al: "Polar code for PBCH and soft combining",3GPP Draft; R1-1718373, Oct. 8, 2017 (Oct. 8, 2017), XP051341555, total 13 pages.
(Continued)

*Primary Examiner* — Hassan Kizou
*Assistant Examiner* — Hector Reyes
(74) *Attorney, Agent, or Firm* — Rimon PC

(57) ABSTRACT

A polar code encoding/decoding method in a communications system is provided, including: determining an information bit location set or a frozen bit location set of a polar code based on an interleaving operation or a corresponding de-interleaving operation; and encoding or decoding the polar code based on the determined information bit location set or frozen bit location set.

17 Claims, 10 Drawing Sheets

(52) U.S. Cl.
CPC .......... *H04L 1/0071* (2013.01); *H04L 12/189*
(2013.01); *H04L 12/1877* (2013.01)

(58) Field of Classification Search
CPC . H04L 12/189; H04L 12/1877; H04L 1/1845;
H04L 1/0068; H04L 1/0041; H04L
1/0045; H04L 1/0009; H03M 13/13
See application file for complete search history.

(56) References Cited

U.S. PATENT DOCUMENTS

| | | | |
|---|---|---|---|
| 2017/0324514 A1 | 11/2017 | Shen et al. | |
| 2017/0338996 A1* | 11/2017 | Sankar | H04L 1/0058 |
| 2018/0026747 A1 | 1/2018 | Rong et al. | |
| 2018/0198894 A1* | 7/2018 | Nammi | H03M 13/13 |
| 2018/0227076 A1* | 8/2018 | Koike-Akino | H04L 1/0041 |
| 2019/0132072 A1* | 5/2019 | Lin | H04L 5/0037 |
| 2019/0158226 A1* | 5/2019 | Hui | H04L 1/0041 |
| 2019/0305874 A1* | 10/2019 | Ahn | H04L 1/0072 |
| 2019/0342896 A1* | 11/2019 | Kusashima | H04W 72/042 |
| 2019/0393897 A1* | 12/2019 | Gresset | H03M 13/353 |

FOREIGN PATENT DOCUMENTS

| | | |
|---|---|---|
| CN | 104079370 A | 10/2014 |
| CN | 104219019 A | 12/2014 |
| WO | 2015074192 A1 | 5/2015 |
| WO | 2016119105 A1 | 8/2016 |
| WO | 2016154968 A1 | 10/2016 |

OTHER PUBLICATIONS

Qualcomm Incorporated, "SS burst composition and time index indication considerations", 3GPP TSG-RAN WG1 NR #88 R1-1702585,Feb. 13, 2017,t otal 6 pages.

Bardet Magali et al : "Algebraic properties of polar codes from a new polynomial formalism", Jul. 10, 2016 (Jul. 10, 2016), pp. 230-234, 2016 International Symposium on Information Theory, XP032940237, total 5 pages.

NTT Docomo, Inc.,"Study on New Radio Access Technology",3GPP TSG RAN meeting #74 ,RP-162201,Vienna, Austria, Dec. 5, 2016, total 148 pages.

ZTE, et al., "Rate Matching of Polar Codes for eMBB," R1-1704385, Agenda item: 8.1.4.2.1.1, 3GPP TSG RAN WG1 Meeting #88bis, Spokane, WA, Apr. 3, 2017, pp. 1-11.

* cited by examiner

ENCODING METHOD, DECODING METHOD, APPARATUS, AND DEVICE

CROSS-REFERENCE TO RELATED APPLICATIONS

This application is a continuation of International Application No. PCT/CN2018/080404, filed on Mar. 24, 2018, which claims priority to Chinese Patent Application No. 201710218791.9, filed on Apr. 5, 2017. The disclosures of the aforementioned patent applications are hereby incorporated by reference in their entireties.

TECHNICAL FIELD

The present invention relates to the field of channel coding/decoding in a communications system, and more specifically, to a polar encoding or decoding method, apparatus, and device.

BACKGROUND

In a communications system, channel coding is usually used to improve data transmission reliability, to ensure communication quality. It has been theoretically proved that polar (Polar) coding is a coding scheme that can be used to achieve a Shannon capacity and that has a simple encoding/decoding method. A polar code is a linear block code. A generator matrix of the polar code is $G_N$. An encoding process of using the polar code is $x_1^N = u_1^N G_N$, where $u_1^N = (u_1, u_2, \ldots, u_N)$ is a binary row vector, $G_N = F_2^{\otimes (\log_2(N))}$, a code length $N = 2^n$, and n a positive integer.

$$F_2 = \begin{bmatrix} 1 & 0 \\ 1 & 1 \end{bmatrix},$$

where $F_2^{\otimes (\log_2(N))}$ is a Kronecker product of $F_2$, and is defined as follows: $F^{\otimes (\log_2(N))} = F \otimes F^{\otimes (\log_2(N))-1}$.

In a process of encoding the polar code, some bits in $u_1^N$ are used to carry information and are referred to as information bits. A set of sequence numbers of these information bits is denoted as A. Some other bits are set to fixed values agreed on in advance by a transmit end and a receive end and are referred to as fixed bits. A set of sequence numbers of the fixed bits is denoted as a complementary set $A^c$ of A. Without loss of generality, these fixed bits are usually set to 0. Actually, a fixed bit sequence may be set randomly provided that the transmit end and the receive end agree in advance. Therefore, a coded bit sequence of the polar code may be obtained by using the following method: $x_1^N = u_A G_N(A)$. Herein, $u_A$ is an information bit set in $u_1^N$. $u_A$ is a row vector with a length of K, that is, $|A|=K$, where $|\cdot|$ represents the quantity of elements in a set. To be specific, K represents the quantity of elements in the set A. $G_N(A)$ is a submatrix of the matrix $G_N$ and that is obtained by using rows corresponding to indices in the set A. $G_N(A)$ is a K×N matrix.

A key to polar code encoding lies in determining of the code length N and the information bit set A. In an existing polar code encoding solution, the information bit set A cannot be obtained through simple calculation, and may also include a check bit or other bits that are helpful in decoding. In the prior art, the information bit set A is mostly determined in an offline calculation and storage manner. To be specific, an encoder and a decoder store in advance a correspondence table between a plurality of mother code sequences, code lengths, and code rates. During polar code encoding, a corresponding mother code sequence is selected from the correspondence table based on a required code rate and code length.

In the prior art, a polar code construction process is a process of selecting the set A. This polar code construction process determines the performance of the encoding/decoding method using the polar code. Common construction methods, namely, methods for calculating reliability of a polar channel, include density evolution (DE), Gaussian approximation (GA), and the like.

The polar code is based on a successive cancellation (SC) decoding algorithm. To be specific, the polar code is decoded sequentially starting from the first bit. A successive cancellation list (SCL) decoding algorithm is an improvement on the SC decoding algorithm. A plurality of candidate decoding results are retained for each bit. After all the bits are decoded, a final decoding result is selected from all the decoding results in a list based on a specific criterion. The criterion may be as follows: Lists are sorted based on path penalty values of the lists, and a list with the smallest path penalty value is selected; or a list that has passed a CRC check is used as the final output.

In the prior art, communication performance of polar encoding/decoding needs to be further improved.

SUMMARY

This application provides a polar coding method, apparatus, and device, to further improve communication performance of polar encoding/decoding. In some cases, information may be implicitly carried in a polar encoding/decoding process, for example, by performing an interleaving operation in the polar encoding/decoding process.

According to a first aspect, a polar code encoding/decoding method in a communications system is provided, including: determining an information bit location set or a frozen bit location set of a polar code based on an interleaving operation or a corresponding de-interleaving operation; and encoding or decoding the polar code based on the determined information bit location set or frozen bit location set.

In addition, a polar code encoding/decoding apparatus in a communications system is provided. Specifically, the apparatus includes units configured to perform the method according to any one of the first aspect or the possible implementations of the first aspect.

According to a second aspect, a polar code encoding/decoding apparatus in a communications system is provided, including a polar code structure determining module (201) and a polar code encoding/decoding module (202), where the polar code structure determining module (201) is configured to determine an information bit location set or a frozen bit location set of a polar code based on an interleaving operation or a corresponding de-interleaving operation; and the polar code encoding/decoding module (202) is configured to encode or decode the polar code based on the information bit location set or the frozen bit location set that is determined by the polar code structure determining module (201).

According to a third aspect, an implementation of this application provides a polar code encoding/decoding apparatus in a communications system. Specifically, the apparatus includes a memory and a processor. The memory and the processor are connected to each other by using a bus system. The memory is configured to store an instruction. The processor is configured to execute the instruction stored in the memory; and when the instruction is executed, the processor performs the method according to any one of the first aspect or the possible implementations of the first aspect.

According to a fourth aspect, this application provides a computer readable medium, configured to store a computer program, where the computer program includes an instruction for performing the method according to any one of the first aspect or the possible implementations of the first aspect.

In the embodiments of the present invention, the system constructs the polar code based on the interleaving operation of the polar code, to encode the polar code or decode the polar code and perform the interleaving operation or the de-interleaving operation that is based on the encoding or the decoding. In this way, transmission performance of the communications system can be improved by using the polar code, and information can be implicitly carried.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

The embodiments of the present invention may be applied to various communications systems, such as a global system for mobile communications (GSM) system, a code division multiple access (CDMA) system, a wideband code division multiple access (WCDMA) system, a general packet radio service (GPRS), a long term evolution (LTE) system, an LTE frequency division duplex (FDD) system, an LTE time division duplex (TDD) system, a universal mobile telecommunications system (UMTS), or a next-generation communications system. All information or data obtained by a base station or a terminal in the foregoing systems by performing encoding processing on conventional turbo code or LDPC code may be applied to polar code encoding in the embodiments.

Figure 1:
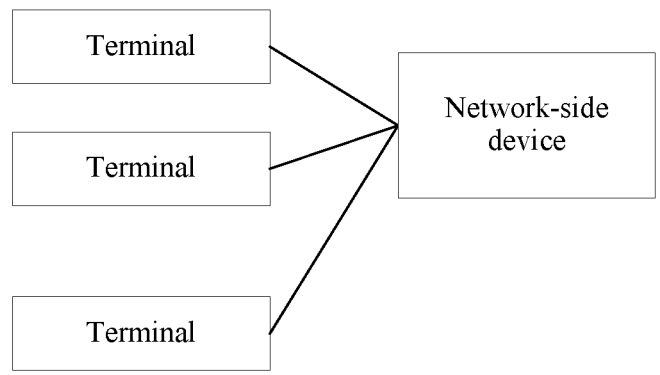
FIG. 1 is a schematic structural diagram of a wireless communications system according to an embodiment of the present invention.

FIG. 1 is a schematic structural diagram of a wireless communications system. The embodiments of this application may be applied to the wireless communications system. As shown in FIG. 1, the wireless communications system optionally includes cells, and each cell includes one network-side device, for example, a base station. The network-side device provides a communication service for one or more terminals or mobile stations (English: Mobile Station, MS for short), and the network-side device may be connected to a core network device.

A base station may be a device that communicates with a terminal device, for example, may be a base station (BTS) in a GSM system or a CDMA system, may be a NodeB (NB) in a WCDMA system, or may be an evolved NodeB (eNB or eNodeB) in an LTE system. Alternatively, the base station may be a relay station, an access point, a vehicle-mounted device, a wearable device, a network-side device in a future 5G network, or the like. The base station may alternatively be a terminal that plays a role of a base station in device-to-device (D2D) communication.

A terminal may communicate with one or more core networks by using a radio access network (RAN). The terminal may be user equipment (UE), an access terminal, a subscriber unit, a subscriber station, a mobile station, a mobile console, a remote station, a remote terminal, a mobile device, a user terminal, a wireless communications device, a user agent, a user apparatus, or the like. The access terminal may be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, a wearable device, a terminal device in a future 5G network, or the like.

To facilitate understanding, the following describes in detail a polar coding method 100 according to the embodiments of the present invention with reference to FIG. 2 to FIG. 5.

Figure 2A:
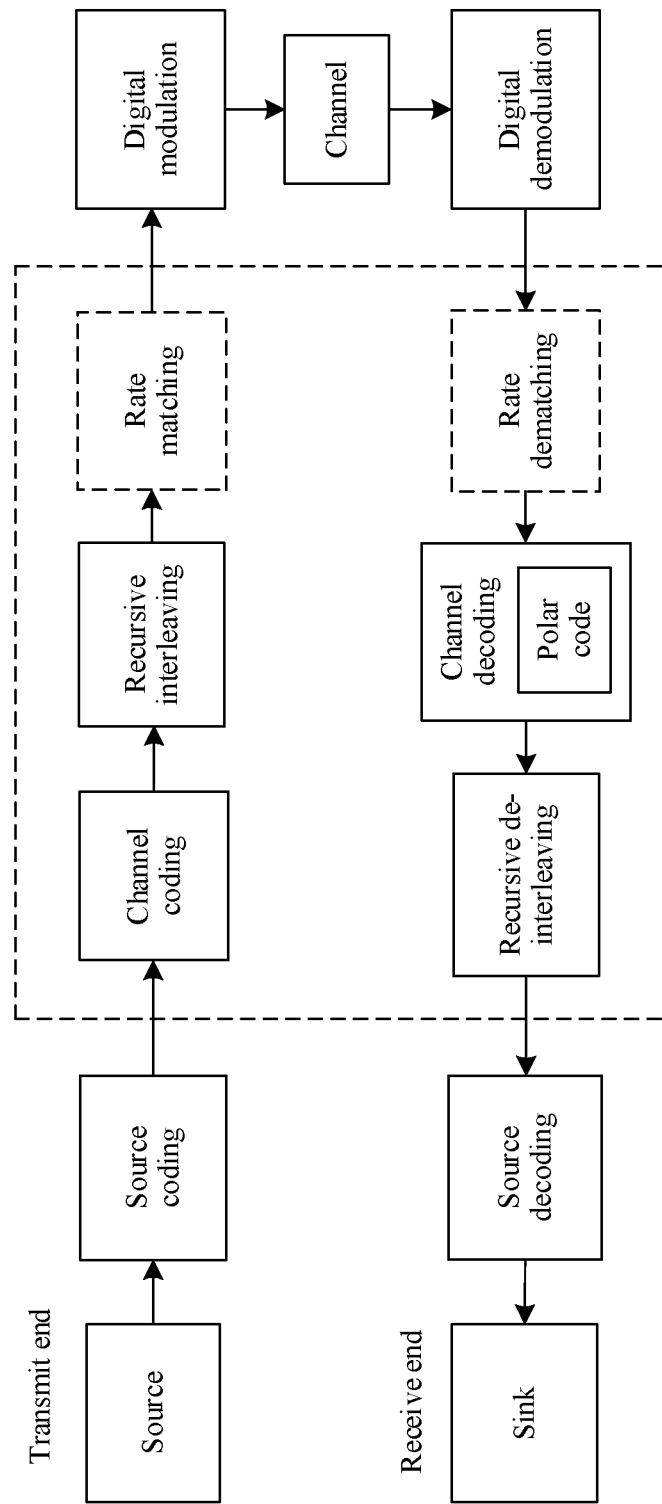
FIG. 2a and FIG. 2b each are a simple schematic diagram of a physical-layer processing process in a wireless communications system.
Figure 2B:
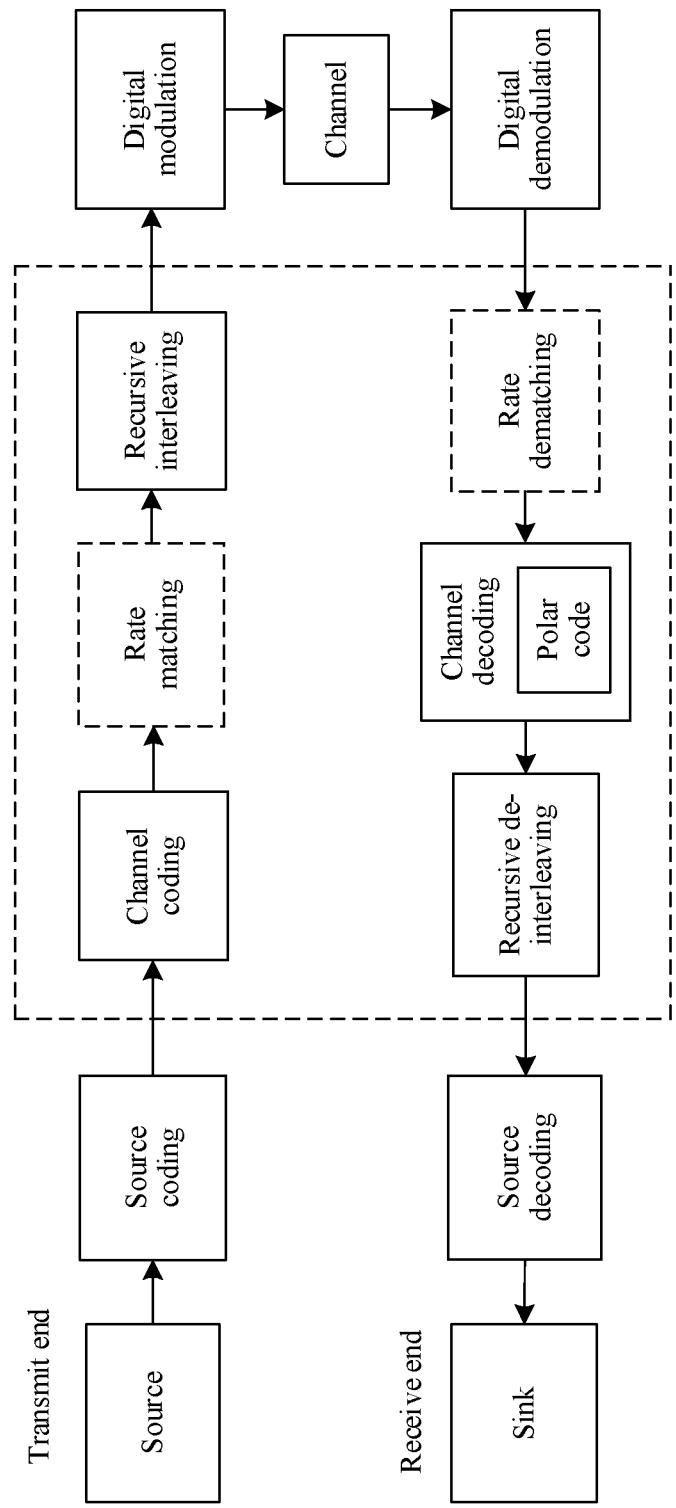

FIG. 2a and FIG. 2b each show a physical-layer processing process in a wireless communications system. At the transmit end, a source undergoes source coding, channel coding, rate matching (optional), and digital modulation, and is sent to the receive end through a channel. At the receive end, a signal received through the channel undergoes digital demodulation, rate dematching, channel decoding, and source decoding to obtain a sink. In implementations of the present invention, an interleaving method with a recursive interleaving feature (also referred to as recursive interleaving) is used. Referring to FIG. 2a, the interleaving process may be performed after the channel coding and before the rate matching; and in this case, a length of a to-be-interleaved sequence during interleaving is the length N of a polar code. Referring to FIG. 2b, the interleaving process may alternatively be performed after the rate matching; and in this case, a length of a to-be-interleaved sequence during interleaving is the target code length M obtained after the rate matching.

The implementations of the present invention relate to channel coding. Channel coding is used to increase redundancy, so as to improve robustness of an information flow when being transmitted on a channel. Generally, a turbo code, a polar (or referred to as polar) code, or a low-density parity-check code (LDPC code) may be used. The implementations of the present invention mainly focus on a channel coding method in which the polar code is used, a corresponding decoding method, and a corresponding apparatus. The channel coding method, the corresponding decoding method, and the corresponding apparatus may be applied to various communications systems, including, but not limited to, a communications system that can support more than two encoding/decoding schemes. Details are not described herein.

To facilitate understanding, the following describes definitions of the symbols that are described above or that may be used below.

K: a length of non-fixed bits, where the non-fixed bits include an information bit and optionally may further include a check bit, a bit used to assist in decoding, and the like;

N: a length of a target quantization sequence, or referred to as a length (which is an integer power of 2) of a mother code of a polar code; and M: a target code length (on an encoding side, M is a code length of a sequence sent subsequently, and if rate matching needs to be performed after polar encoding, M is a code length obtained after the mother code, with a length of N, of the polar code undergoes the rate matching; and on a decoding side, M is a length of an originally received code, and the length N of the target quantization sequence is obtained after rate dematching).

Figure 3:
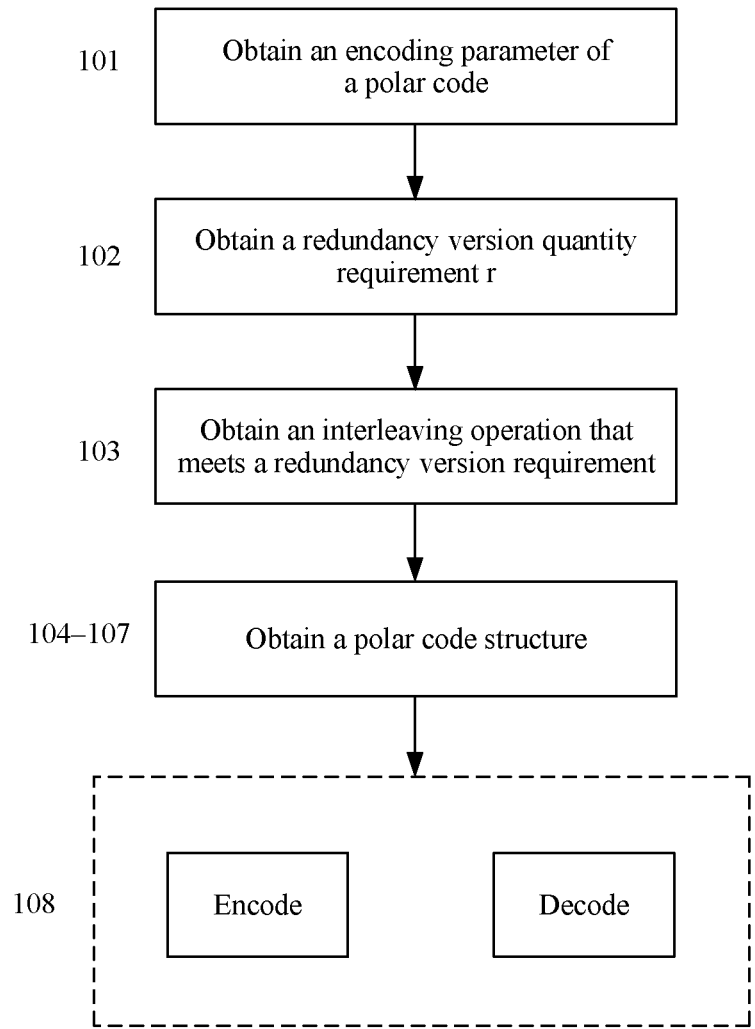
FIG. 3 is a simple flowchart of a polar code construction method in a communications system and an encoding/decoding method based on the construction method.

FIG. 3 is a simple flowchart of a polar code construction method in a communications system and an encoding/decoding method based on the construction method. In this method, an interleaving method with a recursive interleaving feature is used, and a polar code is constructed by using the interleaving method. The polar code constructed by using this method has a recursive interleaving feature. To be specific, for a given to-be-encoded sequence Q1, an encoded codeword C1 is obtained by performing polar code encoding on the to-be-encoded sequence Q1, a sequence C2 is obtained by performing recursive interleaving on C1, and polar code decoding may be directly performed on C2 to obtain a decoded bit sequence Q2. If the decoding process is correct, the original to-be-encoded sequence Q1 can be obtained by performing recursive de-interleaving on Q2. The process is equivalent that de-interleaving is first performed on the sequence C2 to obtain C1, and then decoding is performed to obtain Q1. The polar code constructed by using the method of the present invention has a controllable quantity of redundancy versions. In other words, a minimum quantity of times of recursive interleaving can be controlled, to carry sufficient implicit information. More specifically, the polar code constructed by using the foregoing construction method may be applied to a scenario in which information needs to be implicitly transmitted, for example, a PBCH.

The recursive interleaving means that a plurality of recursive interleaving operations is performed on a to-be-interleaved sequence by performing a specific interleaving operation. Descriptions are provided below by using an example. A quantity of redundancy versions is a quantity of recursive interleaving operations. Cyclic interleaving is a special case of recursive interleaving. In cyclic interleaving, a sequence obtained after a plurality of recursive interleaving operations is the same as an original to-be-interleaved sequence.

In some examples, one subset of sub-channel locations of the polar code or a plurality of mutually exclusive subsets of sub-channel locations of the polar code are obtained based on an interleaving operation, where a sub-channel location in each subset still belongs to this subset and does not belong to other subsets after undergoing any quantity of interleaving operations. The polar code is constructed based on the foregoing subset or subsets. For example, a first part of subsets are selected as an information bit location set, or a second part of subsets are selected as a frozen bit location set, where any subset in the first part of subsets is different from any subset in the second part of subsets. When rate matching needs to be performed, a third part of subsets are selected as a puncturing location set, where a subset in the third part of subsets is different from any subset in the first part of subsets and any subset in the second part of subsets.

The plurality of redundancy versions of the interleaved sequence that are obtained after the plurality of interleaving operations are performed may be used to implicitly carry some information, for example, the information that is implicitly transmitted on the PBCH or the like.

The polar code in the implementations of the present invention has a controllable quantity of redundancy versions, i.e., how many times of interleaving. Specifically, the quantity of redundancy versions may be determined based on a requirement of an application scenario. For example, in a scenario, polar code needs to carry three bits of implicit information by using at least eight redundancy versions. During initial construction of the polar code, an interleaved sequence with a period r greater than or equal to 8 is selected, and the polar code is constructed based on the interleaved sequence. The "period r" herein means that the sequence is converted into the original sequence after undergoing r times of interleaving.

Specifically, the polar code construction method with the foregoing interleaving feature includes the following steps.

101. Determine encoding parameters, including a length N of a mother code, a target code length M, an information bit length K, and the like, of a polar code based on a current transmission requirement.

Because the length of the mother code of the polar code is N, a generator matrix $G_N$ of the polar code is an N×N matrix. The matrix includes $n=\log_2(N)$ base sequences. Except an all-1 row, all other rows in $G_N$ are obtained by performing AND operations between rows in which some or all the base sequences are located. For details, refer to illustrative descriptions below, for example, descriptions of a scenario of transmission on the PBCH. Details are not described herein.

102. Determine a quantity r of redundancy versions of interleaving operations for the polar code based on a quantity of bits that need to be implicitly transmitted, where specifically, $\log_2(r)$ is not less than the quantity of bits that need to be implicitly transmitted.

103. Determine an interleaving operation π, for a base sequence, whose quantity of redundancy versions is r and an interleaving operation ρ for a sequence with a length of $N=2^n$.

For example, correspondingly, the interleaving operation ρ for the sequence with the length of $N=2^n$ is obtained based on the interleaving operation π for the base sequence:

$$\forall\, i \in [0, 2^m - 1]\ \rho(i) = \sum_{j=0}^{m-1} i_{\pi(j)} * 2^{j_u},$$

where $(i_{m-1}, i_{m-2}, \ldots i_0)_2$ is a binary representation of i.

It can be understood that an interleaving operation of $\pi_c:(c_0, c_1, \ldots c_{2^m-1}) \to (c_{\rho(0)}, c_{\rho(1)}, \ldots c_{\rho(2^m-1)})$ on an encoded bit sequence c is equivalent to an interleaving operation of $\pi_u:(u_0, u_1, \ldots u_{2^m-1}) \to (u_{\rho(0)}, u_{\rho(1)}, \ldots u_{\rho(2^m-1)})$ on a bit sequence u that has not been encoded.

104. A sub-channel location set is divided based on the interleaving operation π or ρ, to obtain t mutually exclusive subsets (orbit) $o_1, o_2, o_3, \ldots, o_t$.

The sub-channel location (or referred to as sequence number) set is divided into a plurality of mutually exclusive subsets (which may be also referred to as orbits orbit) based on the interleaving processing. An element (sequence number) in each subset still falls into the subset regardless of a quantity of interleaving operations that have been performed. The interleaving operation may be, for example, the interleaving operation π for the base sequence with a length of n or the interleaving operation ρ for the sequence with a length of N. In short, two mutually exclusive sets means that the two sets do not include any identical element.

105. Select an information bit location set from the foregoing subsets (orbit) $o_1, o_2, o_3, \ldots, o_t$ based on K.

Specifically, some mutually exclusive subsets are selected from the plurality of mutually exclusive subsets, so that a union set of one or more selected mutually exclusive subsets includes K elements. The union set of the one or more selected mutually exclusive subsets is an information bit location set, and the K elements in the set are information bit locations. Specifically, in this implementation, no special limitation is imposed on the one or more subsets that are selected as the information bit location set, provided that a total quantity of elements in these subsets is equal to K.

Certainly, selection of the information bit location set affects performance (for example, BLER performance) of the code. This implementation of the present invention may also be combined with another possible implementation for selecting an information bit location set. Details are not described herein.

Optionally, in 106, if the target code length M is different from the length N of the mother code, that is, when rate matching needs to be performed, a puncturing location set is selected based on the length N of the mother code and the target code length M.

A person skilled in the art knows that, in 107, other subsets except those in the information bit location set and the puncturing location set belong to a frozen bit location set.

Alternatively, a person skilled in the art may also know that 104, 105, and 106 may also be replaced with the following: After the sequence number set is divided into a plurality of subsets by performing the interleaving processing, a union set of some subsets is first selected as a frozen bit location set, and other subsets except those in the frozen bit location set and a possible puncturing location set are selected as an information bit location set.

Correspondingly, this implementation of the present invention further provides an encoding/decoding method or an information transmission method that is based on the foregoing polar code construction manner:

108. Perform encoding/decoding and subsequence processing based on the constructed polar code. For example, in 108a, at a transmit end, $r_i$ times of recursive interleaving are performed in different time sequences i, and processing such as rate matching, modulation, or resource mapping, and transmission is performed on each interleaving result. Alternatively, in 108b, at a receive end, a corresponding reverse operation is performed, where information of i is obtained through blind detection, the information is information that is implicitly transmitted by using the polar code, or an information bit transmitted in another manner is obtained by performing a regular reverse operation.

It should be noted that, in the implementations of the present invention, the transmit end may be a terminal; and in this case, the receive end is a network-side device, for example, a base station. If the transmit end is a network-side device such as a base station, the receive end is a terminal. In a particular scenario, for example, for a PBCH, the transmit end is a network-side device such as a base station, and the receive end is a terminal.

Figure 4A:
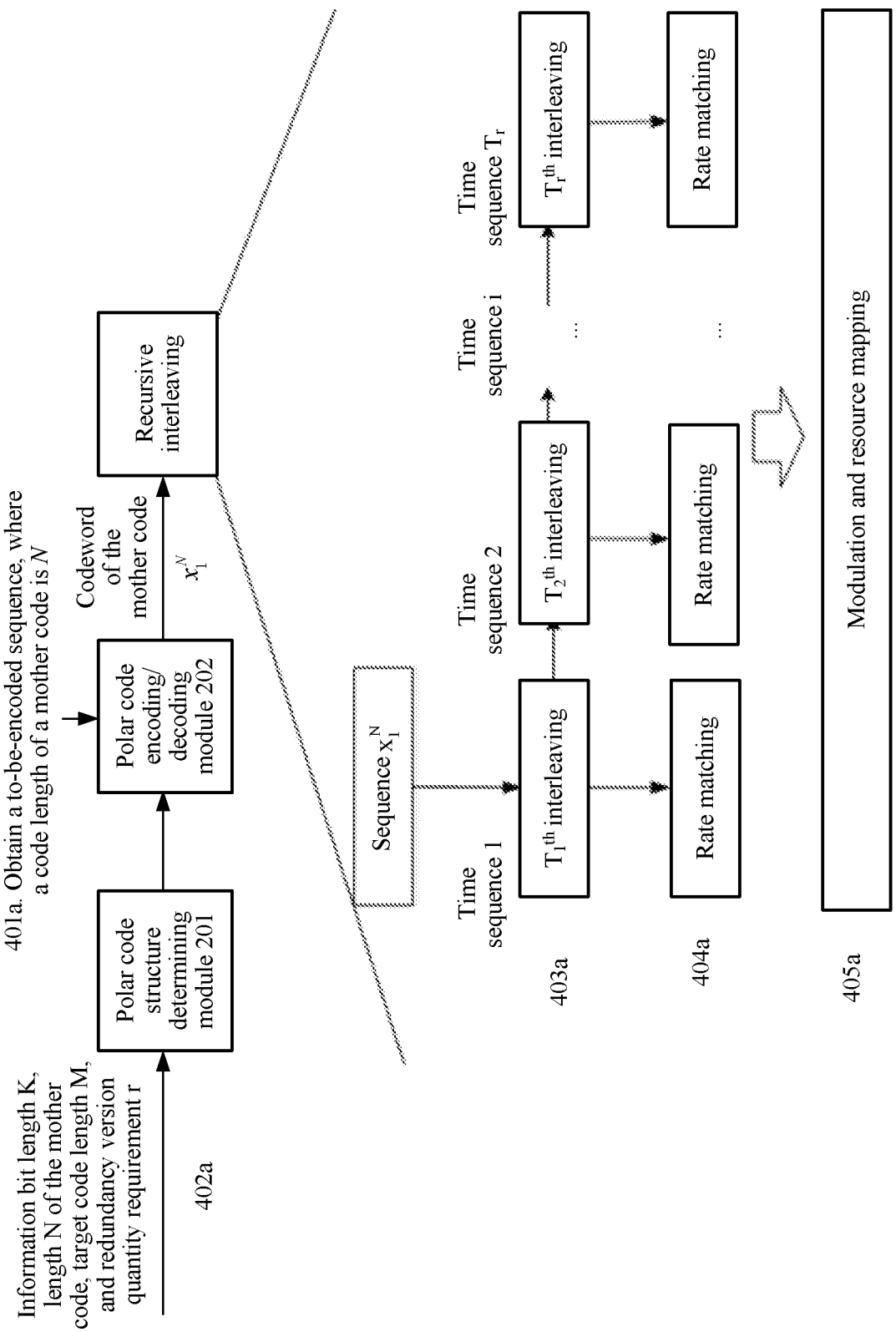
FIG. 4a to FIG. 4d each are a simple schematic diagram of an encoding-side apparatus and a corresponding method or a working principle.
Figure 4B:
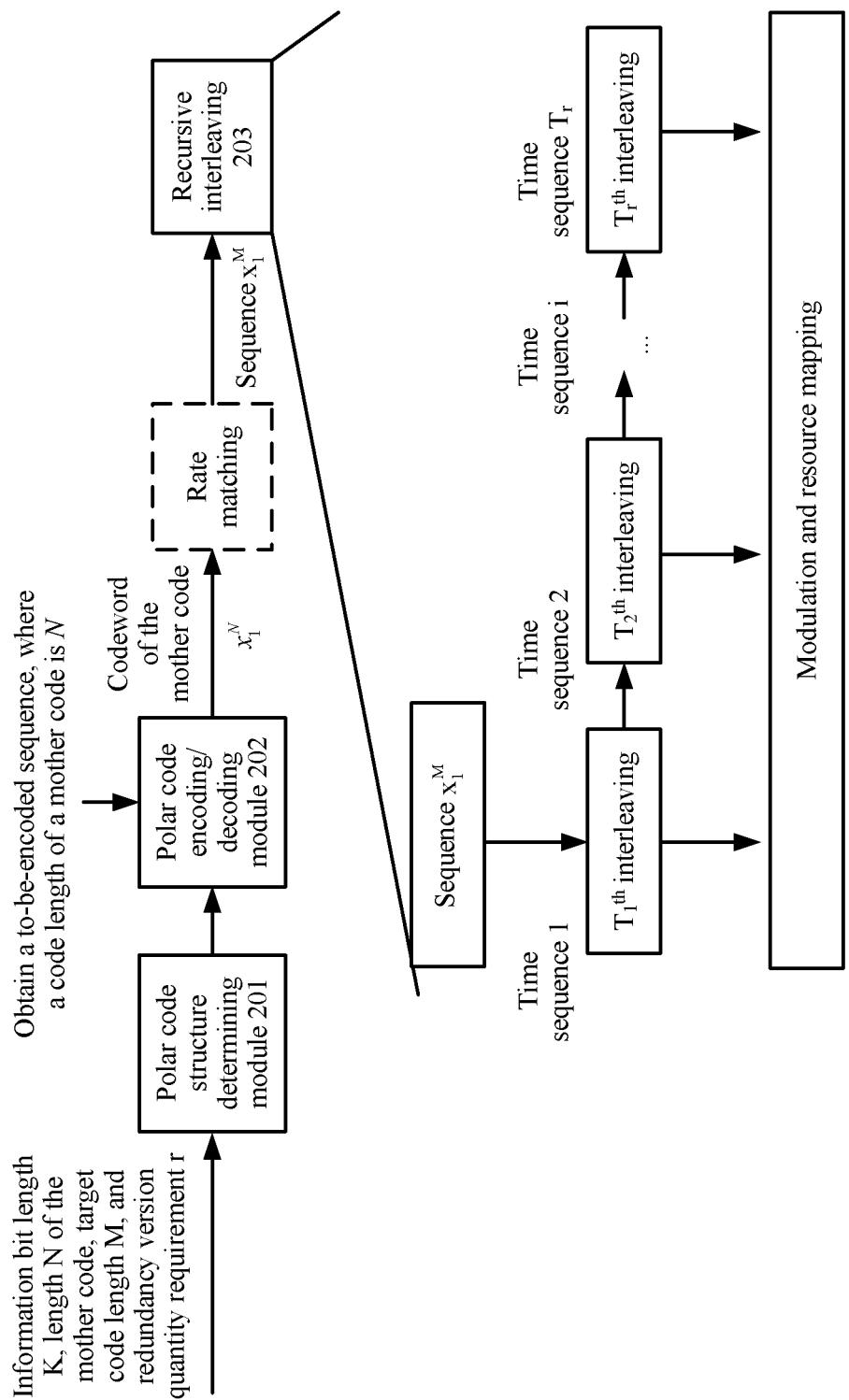
Figure 4C:
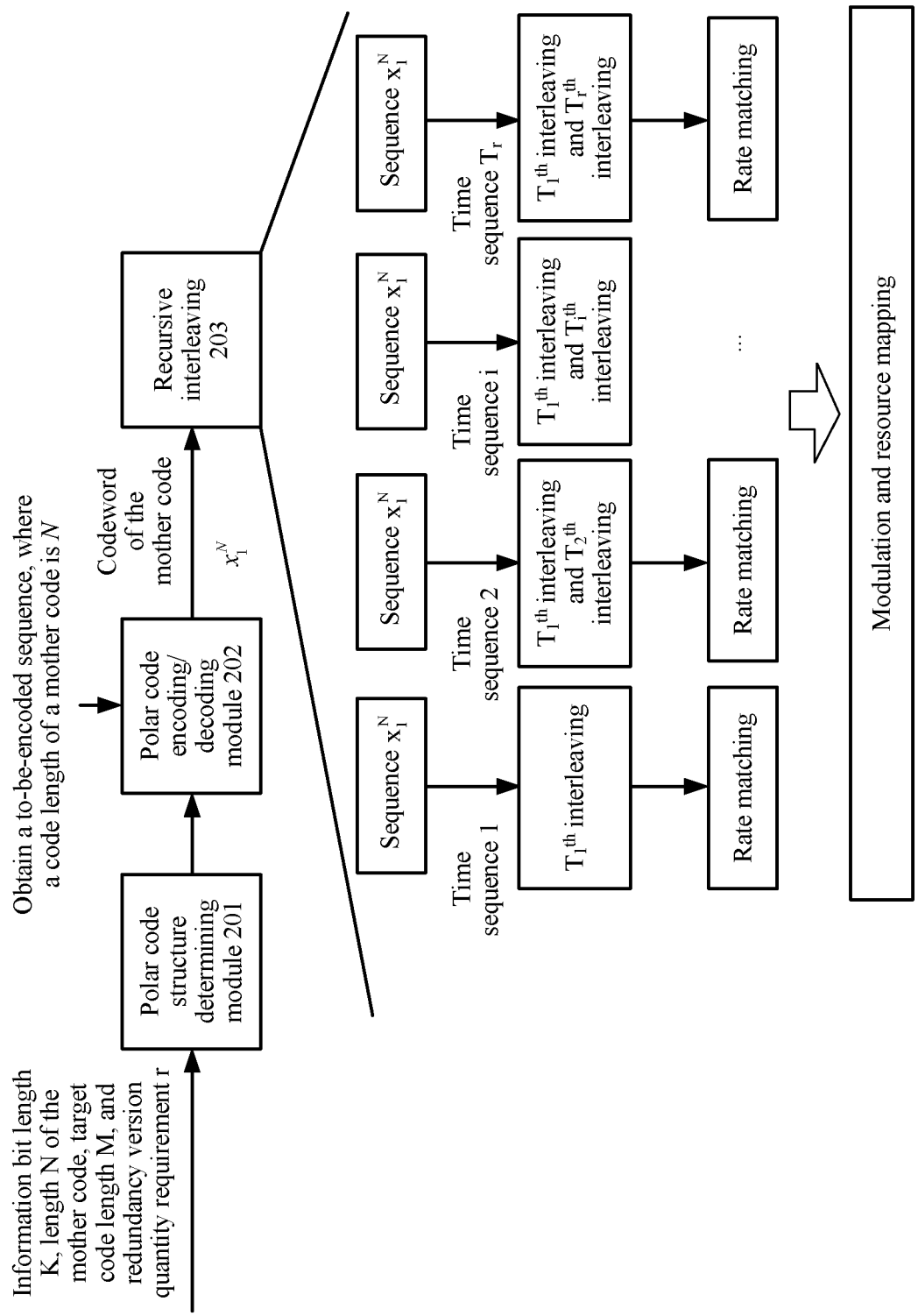

FIG. 4a to FIG. 4c each show an apparatus and a corresponding method or working principle on an encoding side. Referring to FIG. 4a, at a transmit end, an implementation of a polar code sending method includes:

401a. Obtain a to-be-encoded sequence.

For example, in a PBCH-based communication scenario, a CRC bit is added to a to-be-sent master information block MIB, to obtain a to-be-encoded sequence. Certainly, this implementation of the present invention may be applied to another communication scenario. In addition, another manner of obtaining the to-be-encoded sequence is not limited in this implementation of the present invention.

402a. Perform polar encoding to obtain an encoded sequence $x_1^N$.

Encoding is performed based on polar code constructed in the implementation shown in FIG. 3 and by using the to-be-encoded sequence as an input of a non-fixed bit location set (information bit location set), to obtain the encoded sequence $x_1^N$.

403a. Perform, in each time sequence, recursive interleaving on a result of interleaving in a previous time sequence, that is, perform, in an $i^{th}$ time sequence, interleaving (which is denoted as $T_i^{th}$ interleaving) again on a result of previous interleaving of $x_1^N$, where $1 \le i \le r$, and r is a total quantity of time sequences and is also a total quantity of redundancy versions.

During specific implementation, a plurality of solutions may be used to implement recursive interleaving. This implementation is not limited thereto. Refer to other solutions such as a solution shown in FIG. 4c.

404a. Perform rate matching on a sequence that is obtained after the interleaving in each time sequence.

405a. Perform modulation and resource mapping on the sequence on which the rate matching is performed, and send the sequence.

Alternatively, a method in FIG. 4b is different from the method in FIG. 4a in that optional rate matching is performed first, and then a recursive interleaving operation is performed. Certainly, the interleaving operation is performed on a sequence $x_1^M$ on which the rate matching is performed. Therefore, the interleaving operation is also adaptively adjusted. For example, a punctured sub-channel location is deleted from an interleaved sequence. Details are not described herein.

Alternatively, in a specific implementation process, the foregoing solutions may be implemented in another manner. For example, as shown in FIG. 4c, the solution in FIG. 4a may be equivalently replaced with the following: Different quantities of times of recursive interleaving are performed in different time sequences, where a plurality of times of recursive interleaving are performed in each time sequence. In a time sequence i, i times of recursive interleaving (namely, $T_1^{th}, T_2^{th}, \ldots,$ and $T_i^{th}$ interleaving) are performed on an encoded sequence $x_1^N$. In the solution in FIG. 4c, which is different from the solution in FIG. 4a, a plurality of encoded sequences $x_1^N$ are buffered, so that i times of recursive interleaving are performed on each of the encoded sequences $x_1^N$.

Figure 4D:
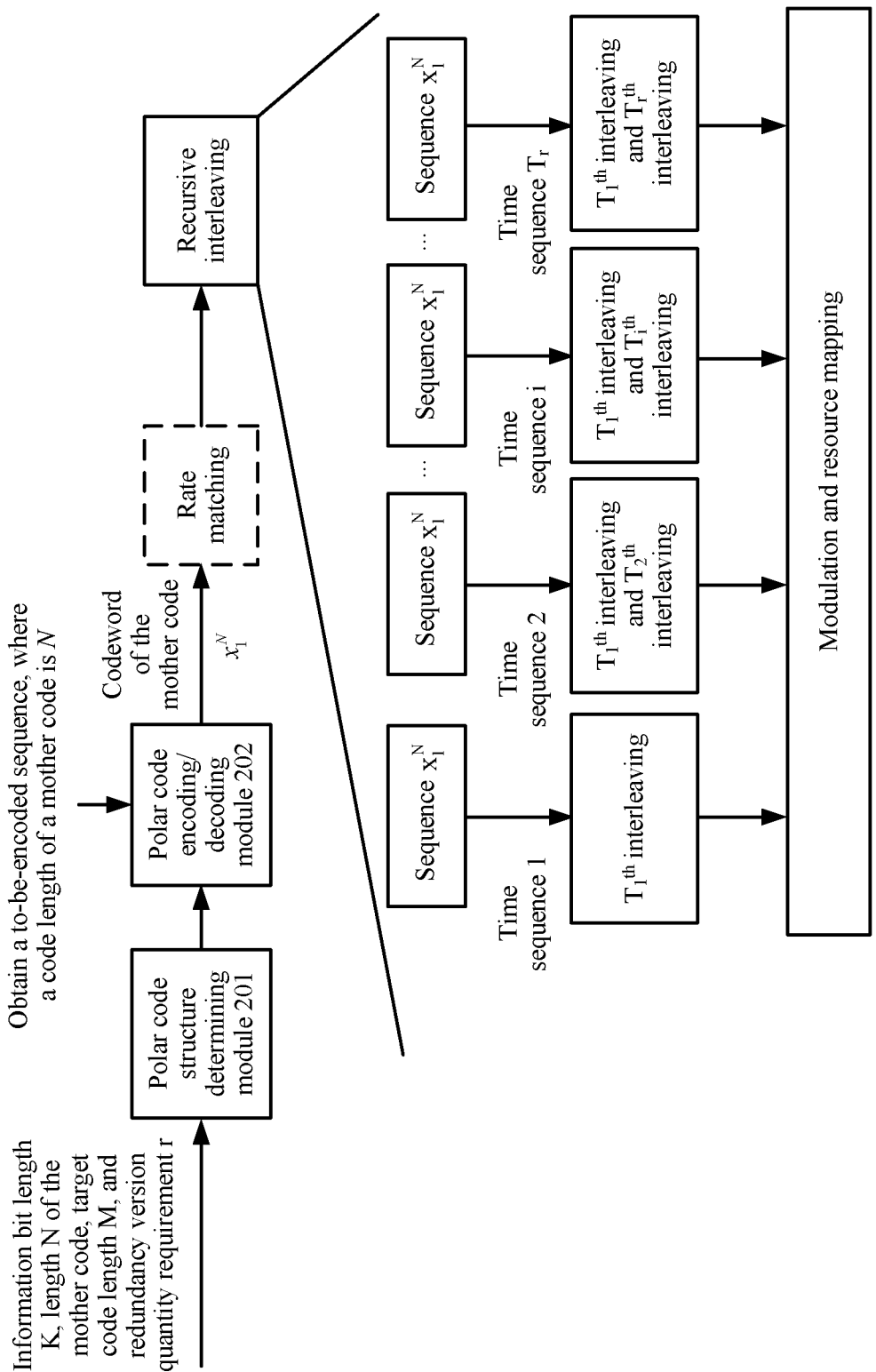

Likewise, the solution in FIG. 4b may also be replaced with the technical solution in FIG. 4d. Details are not described herein.

Referring to a lower part in FIG. 2a, a signal received at a receive end undergoes digital demodulation and optional rate dematching at the receive end, to obtain a log likelihood ratio (LLR).

Figure 5:
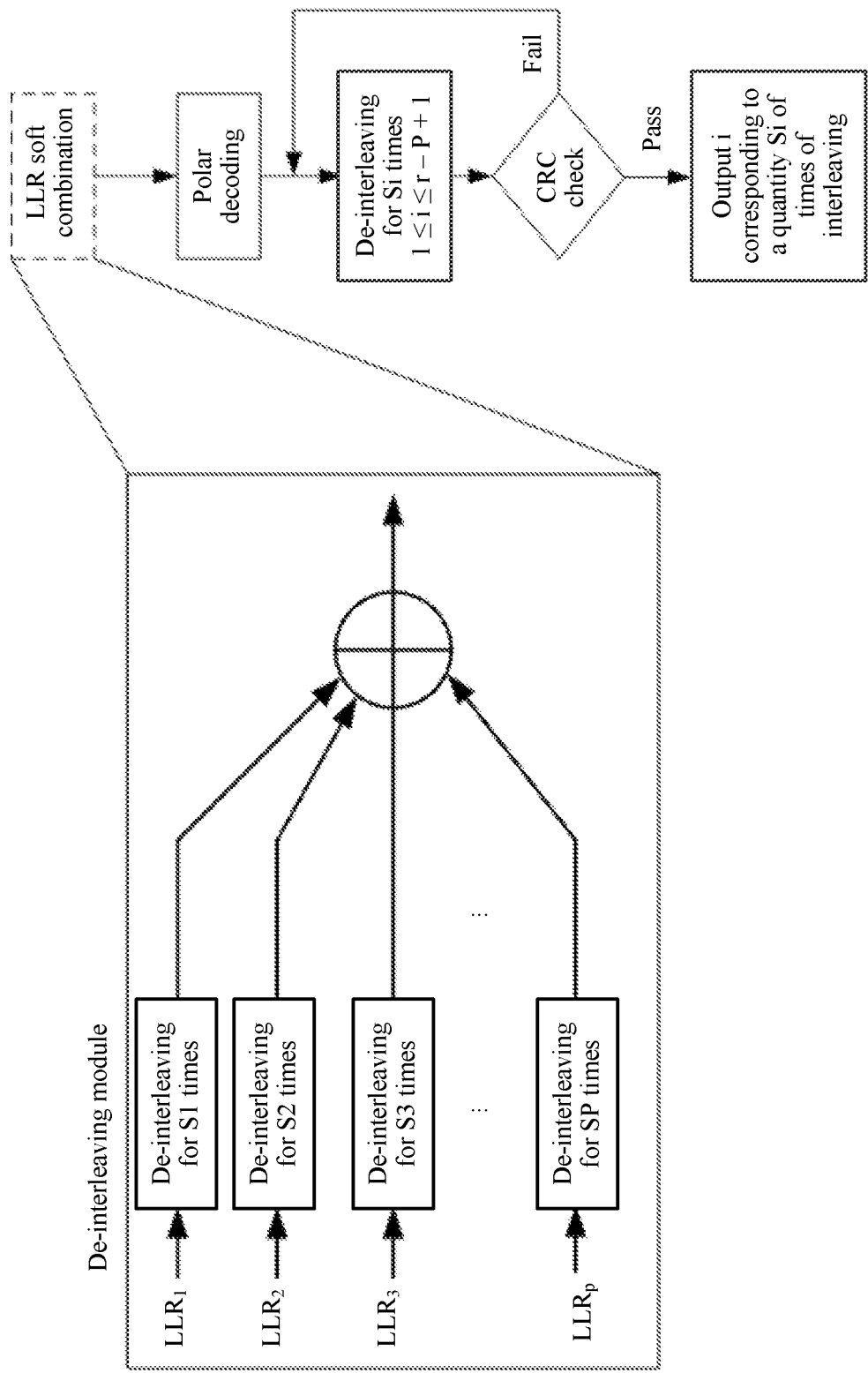
FIG. 5 is a schematic diagram of a structure and a working principle of a decoding-side apparatus according to an embodiment of the present invention.

FIG. 5 is a schematic diagram of a structure and a working principle of a decoding-side apparatus according to an embodiment of the present invention. In a polar code receiving method in an implementation at a receive end, a signal is received, and the signal undergoes operations such as resource demapping, digital demodulation, and optional rate dematching, to obtain an LLR; a decoding attempt is made; if the decoding fails, a plurality of signals are further received, to obtain a plurality of LLRs; and soft combination is performed, and a decoding attempt is made on an LLR obtained through the software combination. The method includes the following steps:

501. If soft combination does not need to be performed, P=1, indicating that only one LLR is received. If software combination needs to be performed, P (P≤r) LLRs are received, and de-interleaving is performed on an $i^{th}$ received LLR for Si times, where 1≤i≤P, and Si is an arithmetic sequence with a difference Δ. Then, soft combination is performed on each LLR obtained after the de-interleaving. In this implementation, a PBCH is used an example of an information bit, but this implementation is not limited thereto.

502. Perform polar code decoding on the LLR (when soft combination is needed, the LLR is an LLR obtained after the soft combination), to obtain a decoded bit sequence.

503. Perform de-interleaving on the decoded bit sequence for Si times, where 1≤i≤R−P+1; and perform a CRC check on a bit sequence obtained after each de-interleaving operation.

504. Obtain a current time sequence i by using the quantity Si of times of de-interleaving corresponding to a de-interleaved sequence on which the CRC check is performed, where the current time sequence i implicitly indicates some information, and details are not described herein.

In the foregoing implementation process, the polar code interleaving method and the corresponding polar code construction method are mentioned. Descriptions are provided below by using specific examples.

Because a length of a mother code of the polar code is N, a generator matrix $G_N$ of the polar code is an N×N matrix. The matrix includes $n=\log_2(N)$ base sequences. Except an all-1 row, all other rows in $G_N$ are obtained by performing AND operations between rows in which the base sequences are located.

Figures 6, 7:
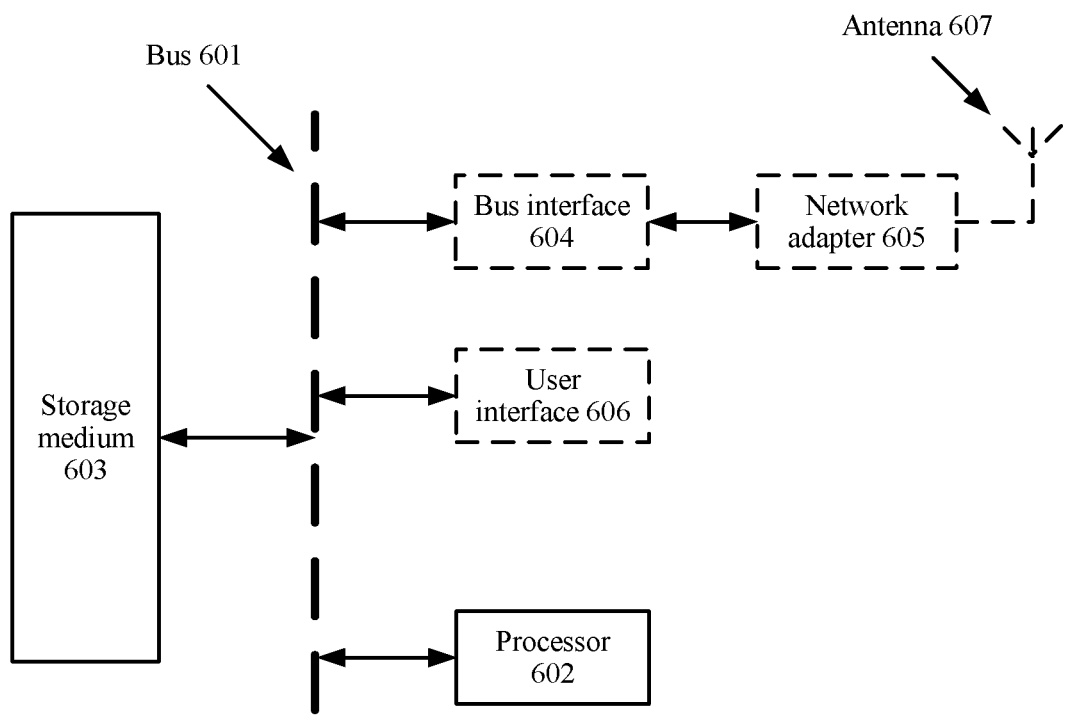
FIG. 6 shows an example of a polar code construction method.
FIG. 7 is a schematic structural diagram of a polar coding device according to an embodiment of the present invention.

For example, N=8. As shown in FIG. 6, the $4^{th}$, $6^{th}$, and $7^{th}$ rows are base sequences, and the base sequences are respectively denoted as $x_2$, $x_1$, and $x_0$. All other rows, except the all-1 $8^{th}$ row, are obtained by performing AND operations between the base sequences. For example, the $2^{nd}$ row is obtained by performing an AND operation between $x_2$ and $x_1$ and is denoted as $x_2x_1$; and the $3^{rd}$ row is $x_2x_0$. All the rows in the generator matrix are numbered from top to bottom starting from 0, [7 6 5 4 3 2 1 0] is obtained, and a binary representation thereof is [111 110 101 100 011 010 001 000], A binary representation [$x_2$ $x_1$ $x_0$] of a row number exactly indicates a base sequence or base sequences on which an "AND" operation is performed to obtain the row. For example, the binary representation [110] of the row number 6 is obtained by performing an AND operation on $x_2$ and $x_1$.

A to-be-encoded sequence that has not been encoded is denoted as $u=[u_0\ u_1\ u_2\ u_3\ u_4\ u_5\ u_6\ u_7]$, and the following is defined:

$$f_u(x_2,x_1,x_0)=u_0 \cdot x_2 x_1 x_0+u_1 \cdot x_2 x_1+u_2 \cdot x_2 x_0+u_3 \cdot x_2+u_4 \cdot x_1 x_0+ u_5 \cdot x_1+u_6 \cdot x_0+u_7 \cdot 1$$

Then, a process of encoding the polar code may be written as:

$$u \cdot G_B = c = (c_0,c_1,c_2,c_3,c_4,c_5,c_6,c_7) = (f_u(7), f_u(6), f_u(5), f_u(4), f_u(3), f_u(2), f_u(1), f_u(0)).$$

Assuming that $u=[0\ 0\ 0\ 1\ 0\ 0\ 1\ 0]$, an encoding result is:

$$u \cdot G_B = (f_u(1,1,1), f_u(1,1,0), f_u(1,0,1), f_u(1,0,0), f_u(0,1,1), f_u(0,1,0), f_u(0,0,1), f_u(0,0,0)) = (0,1,0,1,1,0,1,0)$$

In the following, if interleaving π is performed on a base sequence, an interleaving method is, for example, $\pi(x_0)=x_1$, $\pi(x_1)=x_2$, and $\pi(x_2)=x_0$. it is denoted as:

$$\forall u: \pi(f_u(x_2,x_1,x_0)) \overset{\text{def}}{=} f_u(\pi(x_2), \pi(x_1), \pi(x_0)) = f_u(x_1, x_0, x_2).$$

Interleaving of an encoded bit sequence c (or referred to as a codeword c) is denoted as:

$$\pi_c(c) \overset{\text{def}}{=} (\pi(f_u(1, 1, 1)), \pi(f_u(1, 1, 0)),$$
$$\pi(f_u(1, 0, 1)), \pi(f_u(1, 0, 0)), \ldots, \pi(f_u(0, 0, 0))) =$$
$$(f_u(1, 1, 1), f_u(1, 0, 1), f_u(0, 1, 1), f_u(0, 0, 1), f_u(1, 1, 0),$$
$$f_u(1, 0, 0), f_u(0, 1, 0), f_u(0, 0, 0)) =$$
$$(f_u(7), f_u(5), f_u(3), f_u(1), f_u(6), f_u(4), f_u(2), f_u(0)) =$$
$$(c_0, c_2, c_4, c_6, c_1, c_3, c_5, c_7).$$

Interleaving of a bit sequence that has not been encoded is denoted as:

$$f_u(\pi(x_2), \pi(x_1), \pi(x_0)) =$$
$$f_u(x_1, x_0, x_2) = u_0 \cdot x_2 x_1 x_0 + u_1 \cdot x_1 x_0 + u_2 \cdot x_1 x_2 + u_3 \cdot x_1 + u_4 \cdot x_0 x_2 +$$
$$u_5 \cdot x_0 + u_6 \cdot x_2 + u_7 \cdot 1 = u_0 \cdot x_2 x_1 x_0 + u_2 \cdot x_2 x_1 + u_4 \cdot x_2 x_0 +$$
$$u_6 \cdot x_2 + u_1 \cdot x_1 x_0 + u_3 \cdot x_1 + u_5 \cdot x_0 + u_7 \cdot 1 = f_{\pi_u(u)}(x_2, x_1, x_0),$$

where:

$$\pi_u(u_0, u_1, u_2, u_3, u_4, u_5, u_6, u_7) = (u_0, u_2, u_4, u_6, u_1, u_3, u_5, u_7)$$

It can be learned that a result of the interleaving of the encoded bit sequence c by using $\pi_c$ is the same as a result of the interleaving, by using $\pi_u$, of a bit u that has not been encoded.

The interleaving of the codeword c by using $\pi_c$ is the same as the interleaving, by using $\pi_u$, of the bit u that has not been encoded. The interleaving has the following feature: A set of sequence numbers of bits in a sequence before the interleaving is denoted as $\{0, 1, 2, \ldots, N-1\}$, and the set of sequence numbers is divided into a plurality of mutually exclusive subsets (referred to as orbits) through the interleaving processing, where a sequence number in a subset still falls into the subset regardless of a quantity of times of interleaving processing that has been performed. Still using the foregoing case as an example, a set of sequence numbers $\{0,1,2,3,4,5,6,7\}$ is divided in four subsets (orbit): $\{0\}$, {1,2,4}, {3,5,6}, and {7}. For the bit sequence u that has not been encoded, in is interleaved only to the $1^{st}$, $2^{nd}$, and $4^{th}$ locations (sequence numbers of locations start from 0) regardless of a quantity of times of interleaving that has been performed. This also applies to the encoded bit sequence c.

If an original sequence is obtained after r interleaving operations π are performed on a sequence with a length of n, $\pi_c$ is obtained by using the foregoing method, and the original sequence may also be obtained by performing r interleaving operations $\pi_c$ on a sequence with a length of N=$2^n$. This also applies to $\pi_u$. In other words, r redundancy versions of the sequence u that has not been encoded or the encoded sequence c may be obtained by performing the interleaving operation obtained by using the method. It can be learned that the quantity r of redundancy versions can be controlled by using the method.

If it is required that a sequence obtained after interleaving is performed on a sequence that is obtained by encoding the polar code can be decoded without requiring de-interleaving, an information bit location in the polar code needs to be still at a location of an information bit after the interleaving, and a frozen bit location needs to be still at a location of a frozen bit after the interleaving. Considering the foregoing interleaving operations $\pi_c$ and $\pi_u$, a set of sequence numbers (that is, a bit location set) is divided into a plurality of subsets, and a sequence number in a subset still falls into the subset after interleaving. In this way, referring to FIG. 2b, in the foregoing interleaving method $\pi_c$ or $\pi_u$, bit locations in some subsets may be selected as information bits, and bit locations in some other subsets may be selected as frozen bits. It can be learned from the foregoing analysis that the polar code constructed in this way can meet the requirement that a codeword obtained the interleaving can be directly decoded without requiring de-interleaving. Still using an example in which N=8, K=4. Then, {0} and {1,2,4} may be selected as frozen bits, and {3,5,6} and {7} may be selected as information bits.

By using the method in this implementation, the sequence obtained after the interleaving is performed on the codeword that is obtained by encoding the polar code can still be directly decoded. Different redundancy versions obtained by performing different quantities of interleaving operations may carry different implicit information. Soft combination may further be performed on a plurality of redundancy versions on a decoding side, to obtain a gain brought by energy superposition.

For another example, a polar interleaving method and a corresponding construction method are provided, to meet a requirement of LTE-PBCH configuration. A target code length is M=480, a length of a mother code of a polar code is N=512, an information bit length is K=40, and a quantity of base sequences is $\log_2(512)=9$.

Interleaving of a base sequence is as follows:

$$\pi(x_0)=x_1, \pi(x_1)=x_2, \pi(x_2)=x_3, \pi(x_3)=x_4, \pi(x_5)=x_6, n(x_6)=x_7, n(x_7)=x_0, n(x_B)=x_B.$$

The corresponding interleaving operation $\pi_c$ on the encoded sequence and the corresponding interleaving operation $\pi_u$ on the sequence that has not been encoded can be obtained. It can be learned from the foregoing descriptions that $\pi_c$ and $\pi_u$ are the same and may be represented by using an interleaved sequence ρ. In this embodiment, ρ is shown below, where ρ(i)=j represents that the $i^{th}$ bit in the interleaved sequence is the $j^{th}$ in a sequence that has not been interleaved:

{1 129 2 130 3 131 4 132 5 133 6 134 7 135 8 136 9 137 10 138 11 139 12 140 13 141 14 142 15 143 16 144 17 145 18 146 19 147 20 148 21 149 22 150 23 151 24 152 25 153 26 154 27 155 28 156 29 157 30 158 31 159 32 160 33 161 34 162 35 163 36 164 37 165 38 166 39 167 40 168 41 169 42 170 43 171 44 172 45 173 46 174 47 175 48 176 49 177 50 178 51 179 52 180 53 181 54 182 55 183 56 184 57 185 58 186 59 187 60 188 61 189 62 190 63 191 64 192 65 193 66 194 67 195 68 196 69 197 70 198 71 199 72 200 73 201 74 202 75 203 76 204 77 205 78 206 79 207 80 208 81 209 82 210 83 211 84 212 85 213 86 214 87 215 88 216 89 217 90 218 91 219 92 220 93 221 94 222 95 223 96 224 97 225 98 226 99 227 100 228 101 229 102 230 103 231 104 232 105 233 106 234 107 235 108 236 109 237 110 238 111 239 112 240 113 241 114 242 115 243 116 244 117 245 118 246 119 247 120 248 121 249 122 250 123 251 124 252 125 253 126 254 127 255 128 256 257 385 258 386 259 387 260 388 261 389 262 390 263 391 264 392 265 393 266 394 267 395 268 396 269 397 270 398 271 399 272 400 273 401 274 402 275 403 276 404 277 405 278 406 279 407 280 408 281 409 282 410 283 411 284 412 285 413 286 414 287 415 288 416 289 417 290 418 291 419 292 420 293 421 294 422 295 423 296 424 297 425 298 426 299 427 300 428 301 429 302 430 303 431 304 432 305 433 306 434 307 435 308 436 309 437 310 438 311 439 312 440 313 441 314 442 315 443 316 444 317 445 318 446 319 447 320 448 321 449 322 450 323 451 324 452 325 453 326 454 327 455 328 456 329 457 330 458 331 459 332 460 333 461 334 462 335 463 336 464 337 465 338 466 339 467 340 468 341 469 342 470 343 471 344 472 345 473 346 474 347 475 348 476 349 477 350 478 351 479 352 480 353 481 354 482 355 483 356 484 357 485 358 486 359 487 360 488 361 489 362 490 363 491 364 492 365 493 366 494 367 495 368 496 369 497 370 498 371 499 372 500 373 501 374 502 375 503 376 504 377 505 378 506 379 507 380 508 381 509 382 510 383 511 384 512}.

A sub-channel location (sequence number) set is divided based on the foregoing interleaving operations. Some sets thereof are listed below.

{511}
{510,509,507,503,495,479,447,383},
{255},
{508,505,499,487,463,415,319,382},
{506,501,491,471,431,351,446,381},
{502,493,475,439,367,478,445,379},
{494,477,443,375},
{254,253,251,247,239,223,191,127},
. . .
{0},
{1,2,4,8,16,32,64,128},
{256},
{3,6,12,24,48,96,192,129},
{5,10,20,40,80,160,65,130},
{9,18,36,72,144,33,66,132},
{17,34,68,136}, and
{257,258,260,264,272,228,320,384}.

For K=40, five subsets such as {510,509,507, 503,495, 479,447,383}∪{508,505,499,487,463,415,319,382}∪{506, 501,491, 471,431,351, 446,381}∪{502,493,475,439,367, 478,445,379}∪{254,253,251, 247,239,223,191,127} are selected, where each subset includes eight elements, and sequence numbers corresponding to the 40 elements are information bit locations.

In this implementation, N−M=32 sub-channels need to be eliminated through rate matching, and 32 sub-channels included in {0}∪{1,2,4,8,16,32,64,128}∪{256}∪{17,34, 68,136}∪{3,6,12,24,48,96,192,129}∪{5,10,20,40,80,160, 65,130}∪{9,18,36,72,144,33,66,132} may be punctured. Finally, a polar code structure in which K=40 and M=480 is obtained.

Specifically, for ease of description, the foregoing sequences may be simply denoted as sets O: $O(u_{511})=\{511\}$, $O(u_{510})=\{510,509,507,503,495,479,447,383\}$,
$O(u_{255})=\{255\}$,
$O(u_{508})=\{508,505,499,487,463,415,319,382\}$,
$O(u_{506})=\{506,501,491,471,431,351,446,381\}$,
$O(u_{502})=\{502,493,475,439,367,478,445,379\}$,
$O(u_{494})=\{494,477,443,375\}$,
$O(u_{254})=\{254,253,251,247,239,223,191,127\}$,
. . .
$O(c_0)=\{0\}$,
$O(c_1)=\{1,2,4,8,16,32,64,128\}$,
$O(c_{256})=\{256\}$,
$O(c_3)=\{3,6,12,24,48,96,192,129\}$,
$O(c_5)=\{5,10,20,40,80,160,65,130\}$,
$O(c_9)=\{9,18,36,72,144,33,66,132\}$,
$O(c_{17})=\{17,34,68,136\}$, and
$O(c_{257})=\{257,258,260,264,272,228,320,384\}$ The foregoing solution may also be represented as follows by using the foregoing set symbols: For K=40, five subsets such as $O(u_{510}) \cup O(u_{508}) \cup O(u_{506}) \cup O(u_{502}) \cup O(u_{254})$ are selected, where each subset includes eight elements, and sequence numbers corresponding to the 40 elements are information bit locations. In addition, N−M=32 sub-channels need to be eliminated through rate matching, and 32 sub-channels included in $O(c_0) \cup O(c_1) \cup O(c_{256}) \cup O(c_{17}) \cup O(c_3) \cup O(c_5) \cup O(c_9)$ may be punctured. Finally, a polar code structure in which K=40 and M=480 is obtained. Details are not described herein again.

Specifically, the information bit location set or the frozen bit location set of the polar code may be obtained based on the method or the working principle and the apparatus provided in this implementation of the present invention on both an encoding side and a decoding side, where the information bit location set or the frozen bit location set is applied to an encoding process or a decoding process.

The foregoing describes in detail, with reference to FIG. 1 to FIG. 6, a method for determining a polar code structure, application of the method in polar encoding or decoding, and a method for carrying implicit information through interleaving according to the embodiments of the present invention. FIG. 2a and FIG. 2b each provide a structure of a polar code encoding/decoding apparatus. FIG. 4a to FIG. 4c each describe a working principle of the apparatus from an encoding side; and FIG. 5 describes a working principle of the apparatus from a decoding side. For a working principle or a function of each module, refer to processes in the foregoing methods. Details are not described herein again.

Refer to FIG. 2a, FIG. 2b, FIG. 4a to FIG. 4c, or FIG. 5. In another aspect, an implementation of the present invention correspondingly provides a polar code encoding/decoding apparatus in a communications system, including a polar code structure determining module (201) and a polar code encoding/decoding module (202).

The polar code structure determining module (201) is configured to determine an information bit location set or a frozen bit location set of a polar code based on an interleaving operation or a corresponding de-interleaving operation.

The polar code encoding/decoding module (202) is configured to encode or decode the polar code based on the information bit location set or the frozen bit location set that is determined by the polar code structure determining module (201).

Optionally, the polar code structure determining module (201) is further configured to determine the interleaving operation based on a transmission requirement.

In a specific example, the polar code structure determining module (201) is configured to: obtain one subset of sub-channel locations of the polar code or a plurality of mutually exclusive subsets of sub-channel locations of the polar code, where a sub-channel location in each subset still belongs to this subset and does not belong to other subsets after undergoing any quantity of interleaving operations; and select a first part of the subsets as the information bit location set, or select a second part of subsets as the frozen bit location set, where any subset in the first part of subsets is different from any subset in the second part of subsets.

Optionally, the polar code structure determining module (201) is further configured to: when rate matching needs to be performed, select a third part of subsets as a puncturing location set, where a subset in the third part of subsets is different from any subset in the first part of subsets and any subset in the second part of subsets.

In a specific example, the apparatus further includes:
an interleaving module (203), configured to perform the interleaving operation after the polar code is encoded, where specific information is implicitly carried in the interleaving operation.

Referring to FIG. 5, at a receive end, the apparatus further includes a de-interleaving module, configured to perform the de-interleaving operation after the polar code is decoded, to obtain specific information that is implicitly carried.

Optionally, the apparatus is configured to perform transmission of a radio signal that has been processed as described above on a physical broadcast channel PBCH in a wireless communications system.

A person skilled in the art may understand that the foregoing polar code encoder/decoder may be implemented by using hardware, software, or a combination of software and hardware. The following describes a polar code structure determining apparatus and a corresponding encoding/decoding communications apparatus 600 according to an embodiment of the present invention with reference to FIG. 7.

Alternatively, the communications apparatus 600 may be configured as a general-purpose processing system, which, for example, is generally referred to as a chip. The general-purpose processing system includes one or more microprocessors that provide a function of a processor and at least a part of an external memory that provides a storage medium 603. All these components are connected to another support circuit by using an external bus system structure.

Alternatively, the communications apparatus 600 may be implemented by using the following components: an ASIC (application-specific integrated circuit) that has a processor 602, a bus interface 604, and a user interface 606; and at least a part of a storage medium 603 that is integrated into a single chip. Alternatively, the communications apparatus 600 may be implemented by using one of or any combination of a plurality of an FPGA (field programmable gate array), a PLD (programmable logic device), a controller, a state machine, gate logic, a discrete hardware component, any other suitable circuits, or a circuit that can perform various functions described in this specification of the present invention.

FIG. 7 is a schematic structural diagram of a communications apparatus 600 (for example, a communications apparatus such as an access point or a base station, a site, or a terminal; or a chip in the foregoing communications apparatus) according to an embodiment of the present invention.

In an implementation, as shown in FIG. 7, the communications apparatus 600 may be implemented as a general bus system structure by using a bus 601. According to a specific application and an overall design constraint of the communications apparatus 600, the bus 601 may include any quantities of interconnection buses and bridges. The bus 601 connects various circuits. The circuits may include a processor 602, a storage medium 603, and a bus interface 604. Optionally, in the communications apparatus 600, a network adapter 605 or the like is connected to the bus 601 by using the bus interface 604. The network adapter 605 may be configured to implement a signal processing function at a physical layer in a wireless communications network, and send and receive a radio frequency signal by using an antenna 607. A user interface 606 may be connected to a user terminal, for example, a key board, a display, a mouse, or a joystick. The bus 601 may be further connected to various other circuits, for example, a timing source, a peripheral device, a voltage regulator, or a power management circuit. These circuits are well-known in the art. Therefore, details are not described herein.

The processor 602 is responsible for managing a bus and regular processing (including executing software stored in the storage medium 603). The processor 602 may be implemented by using one or more general-purpose processors and/or dedicated processors. Examples of the processors include a microprocessor, a microcontroller, a DSP processor, and other circuits that can execute software. The software should be broadly construed as representing an instruction, data, or a combination thereof, regardless of whether it is referred to as software, firmware, middleware, microcode, a hardware description language, or the like.

In the figure, the storage 603 is shown as being independent from the processor 602. However, a person skilled in the art can easily understand that the storage medium 603 or any part of the storage medium 603 may be located outside the communications apparatus 600. For example, the storage medium 603 may include a transmission line, a data-modulated carrier waveform, and/or a computer product that is independent of a wireless node. All these media can be accessed by the processor 602 by using the bus interface 604. Alternatively, the storage medium 603 or any part of the storage medium 603 may be integrated into the processor 602, for example, may be a high-speed cache and/or a general-purpose register.

The processor 602 may perform the method in the foregoing embodiments, for example, in FIG. 2a, FIG. 2b, FIG. 4a-FIG. 4c, or FIG. 5 and corresponding implementations. An execution process of the processor 602 is not described in detail herein.

The communications apparatus in the embodiments of this application may be a wireless communications device such as an access point, a site, a base station, or a user terminal.

The polar code in the embodiments of this application includes but is not limited to Arikan polar code, and may be a CA-polar code or a PC-polar code. The Arikan polar code is an original polar code that is not cascaded to other code and has only an information bit and a frozen bit. The CA-polar code is a polar code to which a cyclic redundancy check (CRC) is cascaded. The PC-polar code is a polar code to which a parity check (PC) is cascaded. The PC-polar code and the CA-polar code are cascaded to different codes, to improve performance of the polar code.

The "information bit sequence" in the embodiments of this application may also be referred to as a "to-be-encoded bit sequence" or an "information bit set". Correspondingly, a "quantity of information bits" may be a quantity of to-be-encoded bits in the to-be-encoded bit sequence or a quantity of elements in the information bit set.

In the examples described in the embodiments of this application, units and method processes may be implemented by electronic hardware or a combination of computer software and electronic hardware. Whether the functions are performed by hardware or software depends on particular applications and design constraints of the technical solutions. A person skilled in the art may use different methods to implement the described functions for each particular application.

In the several embodiments provided in this application, it should be understood that the disclosed apparatus and method may be implemented in other manners. For example, the described apparatus embodiments are merely examples. For example, the unit division is merely logical function division and there may be other division in actual implementation. For example, a plurality of units or components may be combined or integrated into another system, or some steps may be ignored or not performed. In addition, the mutual couplings or direct couplings or communication connections between the units may be implemented by using some interfaces, and may be in electronic, mechanical, or other forms.

The units described as separate parts may or may not be physically separate, and may be located in one position, or may be distributed on a plurality of network units.

In addition, function units in the embodiments of this application may be integrated into one processing unit, or each of the units may exist alone physically, or two or more units are integrated into one unit.

All or some of the foregoing embodiments may be implemented by software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive Solid State Disk (SSD)), or the like.

The invention claimed is:

1. A method in a communications system, comprising:
   receiving a bit sequence;
   constructing a polar code by determining an information bit location set or a frozen bit location set of the polar code; and
   encoding or decoding the bit sequence using the polar code based on the determined information bit location set or frozen bit location set;

wherein the information bit location set or the frozen bit location set of the polar code is determined by:
obtaining one subset of sub-channel locations of the polar code or a plurality of mutually exclusive subsets of sub-channel locations of the polar code, wherein a sub-channel location in each subset still belongs to this subset and does not belong to other subsets after undergoing any quantity of interleaving operations; and
selecting a first part of the subset as the information bit location set or selecting a second part of subsets as the frozen bit location set wherein any subset in the first part of subsets is different from any subset in the second part of subsets.

2. The method according to claim 1, wherein the method further comprises:
determining the interleaving operation based on a transmission requirement.

3. The method according to claim 1, wherein the method further comprises:
when rate matching is performed, selecting a third part of the subset as a puncturing location set, wherein a subset in the third part of subsets is different from any subset in the first part of subsets and any subset in the second part of subsets.

4. The method according to claim 1, wherein the method further comprises:
performing the interleaving operation after encoding using the polar code, wherein specific information is implicitly carried in the interleaving operation.

5. The method according to claim 1, wherein the method further comprises:
performing the de-interleaving operation after decoding using the polar code, to obtain the bit sequence carried in the interleaving operation.

6. The method according to claim 1, wherein the method further comprises:
applying the polar code encoding/decoding method to transmission on a physical broadcast channel (PBCH) in a wireless communications system.

7. A device in a wireless communication network, comprising a processor and a memory storing program instructions for execution by the processor;
wherein when executed by the processor, the program instructions cause the device to:
determine an information bit location set or a frozen bit location set of a polar code;
construct the polar code based on the determined information bit location set or frozen bit location set; and
use the polar code to encode or decode a bit sequence;
wherein the information bit location set or the frozen bit location set of the polar code is determined by:
obtaining one subset of sub-channel locations of the polar code or a plurality of mutually exclusive subsets of sub-channel locations of the polar code, wherein a sub-channel location in each subset still belongs to this subset and does not belong to other subsets after undergoing any quantity of interleaving operations; and
selecting a first part of the subset as the information bit location set or selecting a second part of subsets as the frozen bit location set wherein any subset in the first part of subsets is different from any subset in the second part of subsets.

8. An apparatus in a communications system, comprising a polar code structure determining circuit and a polar code encoding/decoding module, wherein the polar code structure determining circuit is configured to determine an information bit location set or a frozen bit location set of a polar code by:
obtaining one subset of sub-channel locations of the polar code or a plurality of mutually exclusive subsets of sub-channel locations of the polar code, wherein a sub-channel location in each subset still belongs to this subset and does not belong to other subsets after undergoing any quantity of interleaving operations; and selecting a first part of the subset as the information bit location set or select a second part of the subset as the frozen bit location set, wherein any subset in the first part of subsets is different from any subset in the second part of subsets; and
the polar code encoding/decoding circuit is configured to encode or decode a bit sequence of a radio signal using the polar code based on the information bit location set or the frozen bit location set that is determined by the polar code structure determining module.

9. The apparatus according to claim 8, comprising a polar code structure determining module, further configured to determine the interleaving operation based on a transmission requirement.

10. The apparatus according to claim 8, wherein the apparatus further comprises:
the polar code structure determining circuit is further configured to: when rate matching is performed, select a third part of subsets as a puncturing location set, wherein a subset in the third part of subsets is different from any subset in the first part of subsets and any subset in the second part of subsets.

11. The apparatus according to claim 8, wherein the apparatus further comprises:
an interleaving circuit, configured to perform the interleaving operation after the polar code is encoded, wherein specific information is implicitly carried in the interleaving operation.

12. The apparatus according to claim 8, wherein the apparatus further comprises:
a de-interleaving circuit, configured to perform the de-interleaving operation after the polar code is decoded, to obtain the bit sequence.

13. The apparatus according to claim 8, wherein the apparatus is configured to perform transmission of the bit sequence encoded using the polar code on a physical broadcast channel (PBCH) in a wireless communications system.

14. The device according to claim 7, wherein the method further comprises:
de-interleave after decoding using the polar code, to obtain the bit sequence that is carried in the interleaving operation.

15. The device according to claim 7, wherein the method further comprises: determine the interleaving operation based on a transmission requirement.

16. The device according to claim 7, wherein the processor is configured to:
when rate matching is performed, selecting a third part of subsets as a puncturing location set, wherein a subset in the third part of subsets is different from any subset in the first part of subsets and any subset in the second part of subsets.

17. The device according to claim 7, wherein the processor is configured to:

interleave after encoding using the polar code, wherein the bit sequence is carried in the interleaving operation.

* * * * *

UNITED STATES PATENT AND TRADEMARK OFFICE
CERTIFICATE OF CORRECTION

PATENT NO. : 11,239,945 B2  Page 1 of 1
APPLICATION NO. : 16/585467
DATED : February 1, 2022
INVENTOR(S) : Aleksei Eduardovich Maevskii et al.

It is certified that error appears in the above-identified patent and that said Letters Patent is hereby corrected as shown below:

On the Title Page

In item (54), in Column 1, in "Title", Line 1, delete "ENCODING METHOD, DECODING" and insert -- POLAR CODE ENCODING/DECODING --.

In the Specification

In Column 1, Line 1, delete "ENCODING METHOD, DECODING" and insert -- POLAR CODE ENCODING/DECODING --.

In the Claims

In Column 17, Line 10, in Claim 1, delete "set" and insert -- set, --.

In Column 17, Line 11, in Claim 1, delete "set" and insert -- set, --.

In Column 17, Line 61, in Claim 7, delete "set" and insert -- set, --.

In Column 17, Line 62, in Claim 7, delete "set" and insert -- set, --.

In Column 18, Line 11, in Claim 8, delete "set" and insert -- set, --.

Signed and Sealed this
Twenty-first Day of June, 2022

Katherine Kelly Vidal
*Director of the United States Patent and Trademark Office*